US 6,620,575 B2

(12) United States Patent
Kim et al.

(10) Patent No.: US 6,620,575 B2
(45) Date of Patent: Sep. 16, 2003

(54) CONSTRUCTION OF BUILT-UP STRUCTURES ON THE SURFACE OF PATTERNED MASKING USED FOR POLYSILICON ETCH

(75) Inventors: Nam-Hun Kim, Cupertino, CA (US); Jeffrey D. Chinn, Foster City, CA (US)

(73) Assignee: Applied Materials, Inc, Santa Clara, CA (US)

( * ) Notice: Subject to any disclaimer, the term of this patent is extended or adjusted under 35 U.S.C. 154(b) by 17 days.

(21) Appl. No.: 09/875,069

(22) Filed: Jun. 5, 2001

(65) Prior Publication Data
US 2001/0041309 A1 Nov. 15, 2001

Related U.S. Application Data

(63) Continuation of application No. 09/243,970, filed on Feb. 4, 1999, now abandoned.

(51) Int. Cl.[7] .......................... G06F 7/36; H01L 21/311
(52) U.S. Cl. .................. 430/314; 430/313; 430/317; 430/322; 430/323; 430/324; 438/694; 438/695; 438/696; 216/37
(58) Field of Search ................................. 430/313, 314, 430/317, 322, 323, 324; 216/37; 438/694, 695, 696

(56) References Cited

U.S. PATENT DOCUMENTS

| 4,392,932 A | * 7/1983 | Harra ........................... 204/192 |
| 4,490,209 A | * 12/1984 | Hartman ....................... 156/643 |
| 5,164,330 A | * 11/1992 | Davis et al. ................... 437/192 |
| 5,166,091 A | 11/1992 | Lifshitz et al. ................ 437/61 |
| 5,166,757 A | 11/1992 | Kitamura et al. ............. 257/53 |
| 5,186,718 A | 2/1993 | Tepman et al. ............. 29/25.01 |
| 5,441,914 A | 8/1995 | Taft et al. .................... 437/189 |
| 5,452,178 A | 9/1995 | Emesh et al. ................ 361/303 |
| 5,525,542 A | 6/1996 | Maniar et al. ............... 437/186 |

(List continued on next page.)

FOREIGN PATENT DOCUMENTS

| EP | 0819786 | 1/1998 | ........... C30B/33/08 |
| EP | 0824269 | 2/1998 | ....... H01L/21/3213 |
| JP | 4-199824 | * 7/1992 | ......... H01L/21/302 |
| JP | 6314689 | 11/1994 | ....... H01L/21/3205 |
| JP | 8078397 | 3/1996 | ....... H01L/21/3065 |
| KR | 9405626 | 6/1994 | ............. G03F/7/26 |

OTHER PUBLICATIONS

A. Jain et al., "Thermal dry–etching of copper using hydrogen peroxide and hexafluoroacetylacetone", *Thin Solid Films*, 269, pp. 51–56 (1995).

(List continued on next page.)

*Primary Examiner*—Mark F. Huff
*Assistant Examiner*—Nicole Barreca
(74) *Attorney, Agent, or Firm*—Shirley L. Church; Kathi Bean; Joseph Bach

(57) ABSTRACT

The present invention pertains to a method for depositing built-up structures on the surface of patterned masking material used for semiconductor device fabrication. Such built-up structures are useful in achieving critical dimensions in the fabricated device. The composition of the built-up structure to be fabricated is dependant upon the plasma etchants used during etching of underlying substrates and on the composition of the substrate material directly underlying the masking material. One preferred method of the present invention for depositing built-up structures upon a patterned mask surface comprises the following steps: (a) providing a patterned mask surface, wherein said patterned mask rests on an underlying substrate; and (b) depositing a polymeric built-up structure over at least a portion of said patterned mask surface using a plasma formed from a source gas comprising $Cl_2$, a compound which comprises fluorine, and an inert gas which provides physical bombardment of surfaces contacted by said plasma.

22 Claims, 6 Drawing Sheets

U.S. PATENT DOCUMENTS

| | | | |
|---|---|---|---|
| 5,539,249 A | 7/1996 | Roman et al. | 257/649 |
| 5,539,256 A | 7/1996 | Mikagi | 257/763 |
| 5,599,743 A | 2/1997 | Nakagawa et al. | 437/194 |
| 5,605,601 A | 2/1997 | Kawasaki | 156/643.1 |
| 5,633,210 A | 5/1997 | Yang et al. | 438/669 |
| 5,635,338 A | 6/1997 | Joshi et al. | 430/325 |
| 5,665,203 A | 9/1997 | Lee et al. | 438/585 |
| 5,668,019 A * | 9/1997 | Kobayashi et al. | 438/163 |
| 5,728,608 A | 3/1998 | Su et al. | 438/149 |
| 5,801,083 A * | 9/1998 | Yu et al. | 438/424 |
| 5,856,239 A * | 1/1999 | Bashir et al. | 438/738 |
| 5,900,163 A * | 5/1999 | Yi et al. | 216/79 |
| 5,942,446 A * | 8/1999 | Chen et al. | 438/734 |
| 5,952,244 A * | 9/1999 | Abraham et al. | 438/714 |
| 5,973,387 A | 10/1999 | Chen et al. | 257/669 |
| 5,998,289 A | 12/1999 | Sagnes | 438/592 |
| 6,004,884 A * | 12/1999 | Abraham | 438/714 |
| 6,065,481 A | 5/2000 | Fayfield et al. | 134/1.3 |
| 2001/0041309 A1 * | 11/2001 | Kim et al. | 430/313 |

OTHER PUBLICATIONS

H. Miyazaki, "Copper Dry Etching Using $Cl_2$ Gas as a Single Reactant and its Application to ULSI", *Semi Technology Symposium,* Nippon Convention Center, Japan, pp. 5/41–5/43 (Dec 1996)..

Yan Ye et al., "0.35–Micron and Sub–0.35–Micron Metal Stack Etch in a DPS Chamber—DPS Chamber and Process Characterization", *Electrochemical Society Proceedings,* vol. 96–12, pp. 222–233 (1996).

* cited by examiner

CONSTRUCTION OF BUILT-UP STRUCTURES ON THE SURFACE OF PATTERNED MASKING USED FOR POLYSILICON ETCH

This application is a continuation application of application Ser. No. 09/243,970, filed Feb. 4, 1999, which is abandoned.

BACKGROUND OF THE INVENTION

1. Field of the Invention

The present invention pertains to a method of selective construction of built-up structures upon the surface of a patterned masking material used for semiconductor fabrication. One of the preferred applications for the method is in the dimensional reduction of patterned openings to provide a desired critical dimension.

2. Brief Description of the Background Art

In the field of semiconductor device fabrication, there is a constant drive to reduce the size of devices, to the point that new techniques must constantly be developed to enable the patterning of smaller feature sizes. Deep UV (DUV) photoresists have been developed which take advantage of shorter wavelengths of ultraviolet radiation to enable the patterning of smaller-dimensioned electronic and optical devices than possible with traditional, or so called I-line photoresists. Generally, the photoresist is applied over a stack of layers of various materials to be patterned in subsequent processing steps. Some of the layers in the stack can cause the reflection of imaging radiation in a manner which causes problems during exposure of the photoresist. To take advantage of the spacial resolution of the photoresist, it is necessary to use an anti-reflective coating (ARC) layer underlying the photoresist, to suppress reflection off other layers in the stack during photoresist exposure. Thus, the ARC layer enables patterning of the photoresist to provide an accurate pattern replication.

A most commonly used ARC material is titanium nitride, a number of other materials have been suggested for use in combination with DUV photoresists. For example, U.S. Pat. No. 5,441,914 issued Aug. 15, 1995 to Taft et al. describes the use of a silicon nitride anti-reflective layer, while U.S. Pat. No. 5,525,542, issued Jun. 11, 1996 to Maniar et al. discloses the use of an aluminum nitride anti-reflective layer. U.S. Pat. No. 5,539,249 of Roman et al., issued Jul. 23, 1996, describes the use of an anti-reflective layer of silicon-rich silicon nitride. U.S. Pat. No. 5,635,338 to Joshi et al., issued Jun. 3, 1997, describes a class of silicon-containing materials which display particular sensitivity in the ultraviolet and deep ultraviolet for the formation of patterns by radiation induced conversion into glassy compounds. U.S. Pat. No. 5,633,210 to Yang et al., issued May 27, 1997 discloses the use of an anti-reflective coating material selected from titanium nitride materials, silicon oxide materials, and silicon oxynitride materials.

FIG. 1 is a schematic of a cross-sectional view of an example etch stack 100 of materials to which pattern transfer is applied, the etch stack including polysilicon, wherein the etch stack includes, from bottom to top: An underlying substrate 102 which depends on the device functionality required, a dielectric layer 104 (typically silicon oxide) is used to separate polysilicon layer 106 from underlying device layers, an ARC (optional) 108 and a patterned photoresist or patterned hard mask 110. When the material used to construct mask 110 is a deep ultra violet (DUV) photoresist, an ARC 108 is used, and one of the more preferred ARCs is silicon oxynitride.

FIG. 1 illustrates a mask 110 having a pattern of lines (110a, 110b, and 110c) and spaces (112a, 112b, and 112c). The space dimension "$d_1$" between lines 110a and 110b will be transferred directly to (through) ARC 108 and other underlying layers, if desired, during the etch process. In Metal Oxide Semiconductor Field Effect Transistors (MOSFETs), polysilicon "pads" of various sizes in particular patterns are formed by etching into the surface of polysilicon layer 106. The desired pad size is produced by controlling the size of the openings in the patterned mask, which controls the size of the spacings surrounding the pads. At this time, photolithography enables the formation of patterns having dimensions $d_1$ in the range of about 0.35 $\mu$m. However, there is a constant demand for reduction in device size, requiring a reduction in the dimension $d_1$, for example. Presently, the demand is for the smallest dimension of a pattern, typically referred to as the "critical dimension" or "CD" to be in the range of about 0.15 $\mu$m.

SUMMARY OF THE INVENTION

The present invention pertains to a method for depositing built-up structures on the surface of patterned masking material used for semiconductor device fabrication. Such built-up structures are useful in achieving critical dimensions in the fabricated device. The composition of the built-up structure to be fabricated is dependant upon the plasma etchants used during etching of underlying substrates and on the composition of the substrate material directly underlying the masking material. If the composition of the built-up structure is inadequate to withstand the plasma etchants used during subsequent etch steps, there can be lateral etching and undercutting of the masking layer so that the desired critical device dimension cannot be obtained from the patterned masking layer.

Typically, polysilicon is etched using a plasma source gas which is a combination of $Cl_2$, HBr, and optionally $O_2$. We have developed a method for depositing built-up structures which can be used when the polysilicon plasma etchant includes HBr as a component. More recently a new plasma etchant for polysilicon has been developed which is a combination of $SF_6$, $Cl_2$ and $N_2$. We have developed an alternative method for depositing built-up structures which can be used when the polysilicon plasma etchant does not include HBr as a component.

One embodiment of the method for depositing built-up structures upon a patterned mask surface includes: providing a patterned mask surface, wherein the patterned mask rests on a predetermined underlying substrate; and depositing a polymeric built-up structure over at least a portion of the patterned mask surface using a plasma formed from a source gas comprising $Cl_2$, a compound which comprises fluorine, and an inert gas which provides physical bombardment of surfaces contacted by the plasma.

This method may be used when the polysilicon plasma etchant source gas includes HBr.

The compound which comprises fluorine preferably includes carbon. More preferably, the compound has the formula $C_x H_y F_z$, where x ranges from 1 to about 5; y ranges from 0 to about 11; and z ranges from 1 to about 10. The compound comprising carbon and fluorine may also contain chlorine. Some of the more preferred fluorine-comprising compounds include, by way of example and not by way of limitation, $CF_4$, $CHF_3$, $CH_2F_2$, $CH_3F$, and $CF_3Cl$.

The inert gas may be selected from the group consisting of helium, nitrogen, argon, krypton, and xenon. Preferably the inert gas is selected from the group consisting of argon, krypton and xenon.

The patterned mask may be comprised of an inorganic masking material, an organic masking material, a hydrocarbon material, or combinations thereof.

To achieve advantageous physical bombardment of the surfaces contacted by the plasma, it is frequently necessary to apply a bias to the patterned mask and underlying substrate. The amount of bias applied is preferably adequate to create a bias voltage on the surface of said mask ranging from about −200 V to about −600 V. Use of a substrate which includes silicon and oxygen as the underlying substrate beneath the patterned mask man may be helpful. An underlying substrate which comprises silicon, oxygen and nitrogen is known to work well.

When the source gas used during the polysilicon etching may cause side reactions with residues from the source gas used during the formation of the built-up layer, it may be advisable to modify the source gas used during the formation of the built-up layer. For example, when HBr is not a component of the polysilicon etch source gas, the preferred method for depositing built-up structures on a patterned mask surface includes: providing a patterned mask surface which rests on a predetermined underlying substrate; and, depositing a polymeric built-up structure over at least a portion of the patterned mask surface using a plasma formed from a source gas comprising $Cl_2$, $NH_3$ and an inert gas which provides physical bombardment of surfaces contacted by said plasma. The predetermined substrate underlying the patterned mask preferably includes silicon and oxygen. An underlying substrate comprising silicon, oxygen, and nitrogen has been determined to work well.

The inert gas may be selected from the group consisting of helium, nitrogen, argon, krypton, and xenon. Preferably the inert gas is selected from the group consisting of argon, krypton and xenon.

The patterned mask may be comprised of an inorganic masking material, an organic masking material, a hydrocarbon material, or combinations thereof.

To achieve advantageous physical bombardment of the surfaces contacted by the plasma, it is frequently helpful to apply a bias to the patterned mask and underlying substrate. The amount of bias applied preferably is adequate to create a bias voltage on the surface of said mask ranging from about −200 V to about −600 V.

DETAILED DESCRIPTION OF THE PREFERRED EMBODIMENTS

Figure 1:
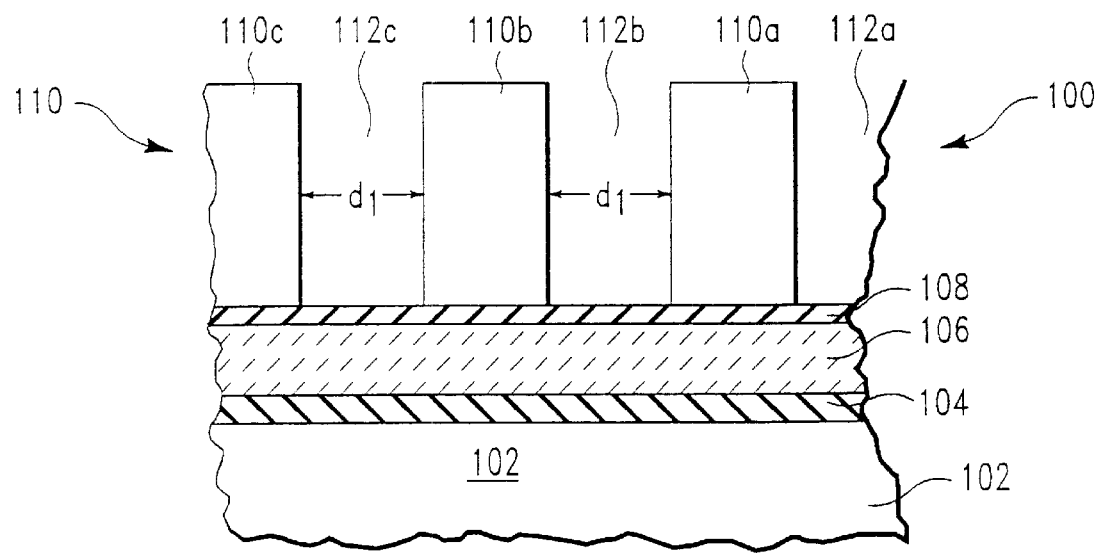
FIG. 1 shows a schematic of a cross-sectional view of a typical etch stack, including a patterned photoresist mask overlying a polysilicon layer to which the pattern is to be transferred.

The present invention pertains to a method for depositing built-up structures on the surface of a patterned mask used for semiconductor device fabrication. The built-up structures are useful in achieving critical dimensions in the fabricated device. In particular, the method permits a significant improvement in the minimum dimensions which can be produced in a semiconductor device from a patterned mask where the pattern was created using radiation. The built-up structures may be selectively deposited on a surface of a patterned photoresist (or other masking material such as inorganic hard masking material), to enable the formation of a mask having even smaller dimensional features.

The preferred embodiments described in the examples presented subsequently are with reference to selective sidewall build up on a patterned DUV photoresist which rests upon the surface of a silicon oxynitride ARC layer. However, the method is clearly applicable to other semiconductor structures comprised of similar materials known in the art of semiconductor fabrication.

The method has permitted the formation of device structures having a critical dimension of 0.13=0.02 $\mu$m. Such critical dimensions have been achieved by reducing at least one opening dimension in the patterned mask by depositing a built-up structure on at least one surface of the mask. The built-up structure is created using a plasma to generate polymeric species which are deposited upon surfaces of openings which pass through the mask to the underlying substrate. The composition of the built-up structure formed depends on the plasma source gases present during deposition of the built-up structure and upon materials which are physically bombarded by high energy species from the plasma during deposition of the built-up structure. For example, the patterned mask itself is bombarded by high energy species which tend to sputter atoms from the mask surface and to make portions of the surface more reactive. The surface of the substrate material underlying the patterned mask is bombarded in areas where there are openings through the mask to the surface of the underlying material. Species sputtered from the underlying material tend to bounce up against the side walls of the mask opening. It is the combination of high energy atomic species from the plasma source gas, from the masking material and from the underlying substrate material which form the built-up structures on the side walls of the mask opening. The built-up structures enable the creation of a mask having smaller openings, which makes possible the formation of smaller device critical dimensions.

To be useful in creating a smaller device critical dimension, not only must the method enable the deposition of the built-up structure, but the built-up structure must be able to withstand the etch plasma used to transfer the pattern from the mask through the desired layers of substrate underlying the mask. This means the composition of the built-up structure must be designed with the composition of the substrate etchant plasma in mind.

Further, the chemical reactions between species from the plasma used to form the built-up structure, the masking material and the underlying substrate material must be such that harmful particulates such as insoluble salts are not formed on the mask surfaces, process chamber surfaces or on the substrate surface itself.

We have discovered particular plasma source gas compositions which can be used to form built-up structures on surfaces of a patterned mask used to transfer a pattern during the etching of an underlying polysilicon substrate. The plasma source gas used during formation of the built-up structures depends on the plasma source gas which is used to etch the pattern into the underlying polysilicon layer.

In particular, we discovered that when the plasma source gas for etching of the polysilicon contains HBr, the plasma source gas used during formation of the built-up structures should not contain $NH_3$ or other compounds which can react with HBr to form a salt. When the plasma source gas for etching of the polysilicon does not contain HBr, the plasma source gas used during formation of the built-up structures can be selected from an increased number of compounds, including $NH_3$.

We have also discovered that it is helpful to apply a bias to the substrate during formation of the built-up structures, to increase the physical bombardment of the surfaces of mask openings toward the bottom of the mask, providing a more uniform deposition of the built-up structure over the entire mask opening surface. When it is desired to increase the physical bombardment of the substrate underlying the mask in the areas where there are openings through the mask, the bias applied to the substrate needs to be further increased. However, if too much substrate surface bias is used, for example more than about −1000 V, this causes undesirable side reactions in the polymer formation for deposition of the built-up structure and may cause damage to underlying substrate and underlying devices. We tested up to substrate surface bias of about −600 V and found this to be acceptable.

I. DEFINITIONS

As a preface to the detailed description of the preferred embodiments of the invention, it should be noted that, as used in this specification and the appended claims, the singular forms "a", "an", and "the" include plural referents, unless the context clearly dictates otherwise. Thus, for example, the term "a semiconductor" includes a variety of different materials which are known to have the behavioral characteristics of a semiconductor.

Specific terminology of particular importance to the description of the present invention is defined below.

The term "applied bias power" refers to, but is not limited to, the power applied to the substrate pedestal to create a bias on a surface of a substrate.

The term "critical dimension" refers to, but is not limited to the dimension which must be controlled for a device to function properly.

The term "feature" refers to, but is not limited to, device components such as metal lines, metal contact plugs, trenches and openings in a dielectric layer, and other structures which make up the topography of a semiconductor device. "Feature Size" often refers to the smallest dimension of a given feature. The feature size and the critical dimension of a given device structure can be the same, but this is not always the case.

The term "physical bombardment" refers to, but is not limited to, the collision of neutral atoms, ions, and other species with a surface.

The term "selectivity" is used to refer to a) a ratio of etch rates of two materials; and b) a condition achieved during etch when etch rate of one material is increased in comparison with another material.

The term "substrate" includes semiconductor materials, glass, ceramics, polymeric materials, and other materials of use in the semiconductor industry.

The term "vertical profile" refers to, but is not limited to, a feature profile or a mask opening profile, wherein a cross-section of the feature or mask opening exhibits side walls which are perpendicular to the surface on which the feature or mask stands. Alternatively, a "positive profile" is one where the width of a cross-section of the feature is larger at the substrate surface on which the feature stands than at a distance away from this surface; and a "negative profile" is one where the width of a cross-section of the feature is smaller at the substrate surface on which the feature stands than at a distance away from such surface.

II. AN APPARATUS FOR PRACTICING THE INVENTION

The preferred embodiment processes described herein for forming the built-up structures of the present invention were carried out in a Centura® DPS™ processing system available from Applied Materials, Inc. of Santa Clara, Calif. This kind of system is shown and described in U.S. Pat. No. 5,186,718, the disclosure of which is hereby incorporated by reference. Preferably, this equipment provides for independent control of plasma source power and substrate bias power. Equipment which provides for such independent power controls was described by Yan Ye et al. at the Proceedings of the Eleventh International Symposium of Plasma Processing, May 7, 1996 and was published in the Electrochemical Society Proceedings, Volume 96–12, pp. 222–233 (1996). The plasma processing chamber enables the processing of an 8 inch (200 mm) diameter silicon wafer.

Figure 8:
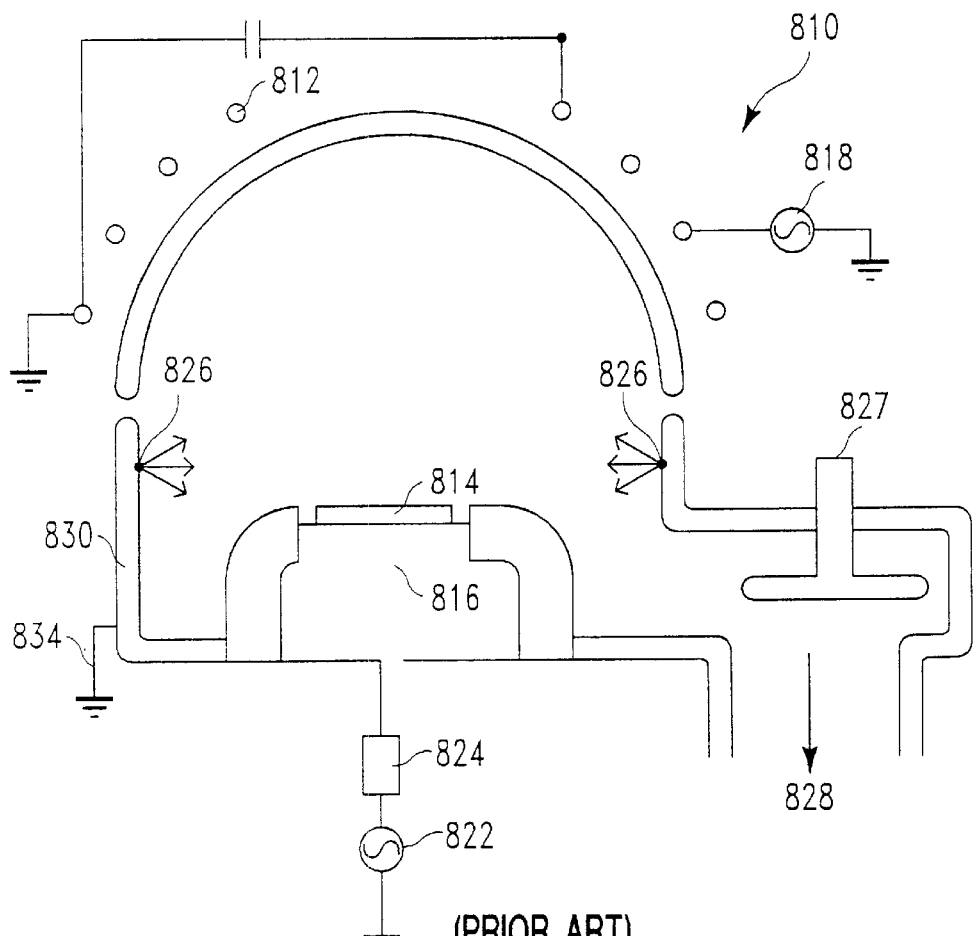
FIG. 8 is a schematic of a plasma processing apparatus of the kind used in carrying out both the fabrication of the built-up structures and the etching processes described herein.

A schematic of the processing chamber is shown in FIG. 8 which shows an etching process chamber 810, which is constructed to include at least one inductive coil antenna segment 812 positioned exterior to the etch process chamber 810 and connected to a radio frequency (RF) power generator 818 (source power generator with a frequency tunable around 12.56 MHZ for impedance matching at different plasma conditions). Interior to the process chamber is a substrate 814 support pedestal (cathode) 816 which is connected to an RF frequency power generator 822 (bias power generator of frequency fixed at 13.56 MHZ) through an impedance matching network 824, and a conductive chamber wall 830 which serves as the electrical ground 834.

The semiconductor substrate 814 is placed on the support pedestal 816 and gaseous components are fed into the process chamber through entry ports 826. A plasma is ignited in process chamber 810 by applying RF powers 818 and 822. Pressure interior to the etch process chamber 810 is controlled using a vacuum pump (not shown) and a throttle valve 827 situated between process chamber 810 and the vacuum pump. The temperature on the surface of the etch chamber walls is controlled using liquid-containing conduits (not shown) which are located in the walls of the etch chamber 810. The temperature of the semiconductor substrate is controlled by stabilizing the temperature of the support pedestal and flowing helium gas in the channels formed by the back of the substrate and grooves (not shown) on the pedestal 816 surface. The helium gas is used to facilitate heat transfer between the substrate and the pedestal. During the etch process, the substrate surface is gradually heated by the plasma to a steady state temperature which is approximately 25–40 ° C. higher than the substrate support platen temperature, depending on the process conditions. It is estimated that the substrate surface temperature was typically around 75° C. during most of our experiments. The surface of the etching chamber 810 walls was maintained at about 80° C. using the cooling conduits previously described.

III. EXAMPLES OF FORMATION OF BUILT-UP STRUCTURES ON THE SURFACES OF A PATTERNED MASK

Figure 2:
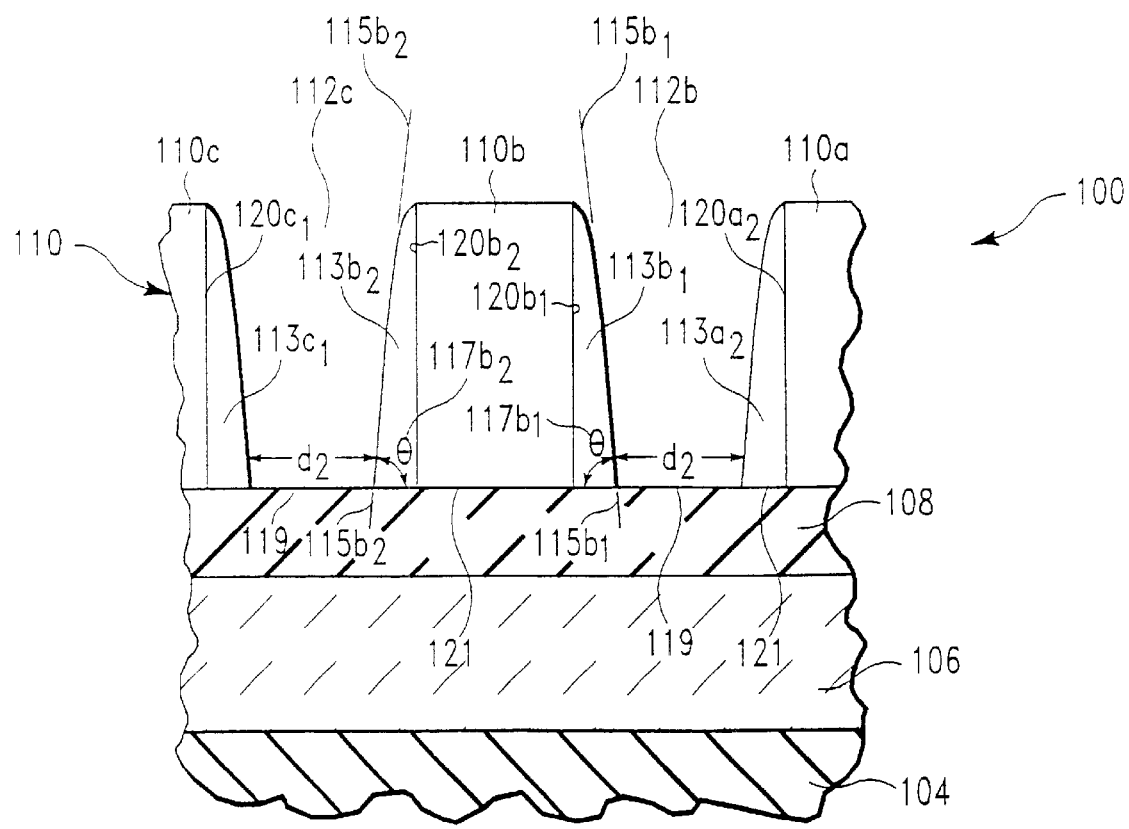
FIG. 2 shows a schematic of a cross-sectional view of the etch stack of FIG. 1, but after construction of built-up structures upon the surface of the patterned photo resist mask.

FIG. 2 illustrates one preferred embodiment of the present invention using a schematic of a cross-sectional view of the etch stack of FIG. 1, but after construction of built-up structures upon the surface of the patterned mask. The built-up structure provides a smaller critical dimension (CD) by making the mask 110 opening dimension $d_1$ shown in FIG. 1 smaller than the 0.35 $\mu$m obtained using typical mask imaging and patterning techniques. FIG. 2 shows the formation of a built-up layer $113a_2$ on the sidewall $120a_2$ of line 110a; a built-up layer $113b_1$ on the sidewall $120b_1$ of line 110b; a built-up layer $113b_2$ on the sidewall $120b_2$ of line 110b; and a built-up layer $113c_1$ on the sidewall $120c_1$ of line 110c. This built-up layer may be formed by deposition of an inorganic-based or an organic-based material upon the surface of the patterned mask 110. When the mask 110 is a photoresist, the material used to form the built-up layer 113 is typically an organic polymeric material. Construction of built-up layers 113 on side walls 120 decreases the original mask opening dimension $d_1$ to a new dimension "$d_2$". The dimension $d_2$ will vary from the top of the mask opening toward the bottom of the mask opening, depending on the uniformity of thickness of polymer deposition which forms built-up layer 113. A tangent $115b_1$ or $115b_2$ drawn along the surface of built-up layer $113b_1$ or $113b_2$, respectively forms an angle θ, such as $117b_1$ or $117b_2$, respectively with a line 121 drawn horizontally along the base of the mask 110 opening 112. Preferably the angle θ is greater than 70 degrees. The optimum would be an angle θ of 90 degrees. The key to success then becomes the ability to selectively deposit a built-up layer 113 on the surfaces of mask 110 side wall 120 in a manner which: 1) permits control over the uniformity of the thickness of the built-up layer 113 deposited along the length of side wall 120 from top to bottom so that an angle θ of at least 70 degrees is obtained; 2) leaves the base 119 at the bottom of the opening 112 essentially polymer free (to facilitate etching through the opening); 3) permits control of the uniformity of the thickness of the built-up layer 113 on all side wall surfaces 120 from the outer edge of the mask 110 to the center of the mask 110 (illustrated built-up layer thicknesses $113a_2$, $113b_1$, $113b_2$, $113c_1$, etc.) so that the final etched pattern will be uniform across the entire substrate; while providing a built-up layer which can withstand the plasma etchant used to transfer the pattern from the mask 110 through underlying polysilicon layer 106 (and optional ARC layer 108 when present).

For a critical dimension of about 0.15 $\mu$m, the variation in the sidewall 113 thickness from mask edge to mask center should be less than about=0.008 $\mu$m. A typical specification is for a nominal value±5 %.

EXAMPLE ONE

Figure 3:
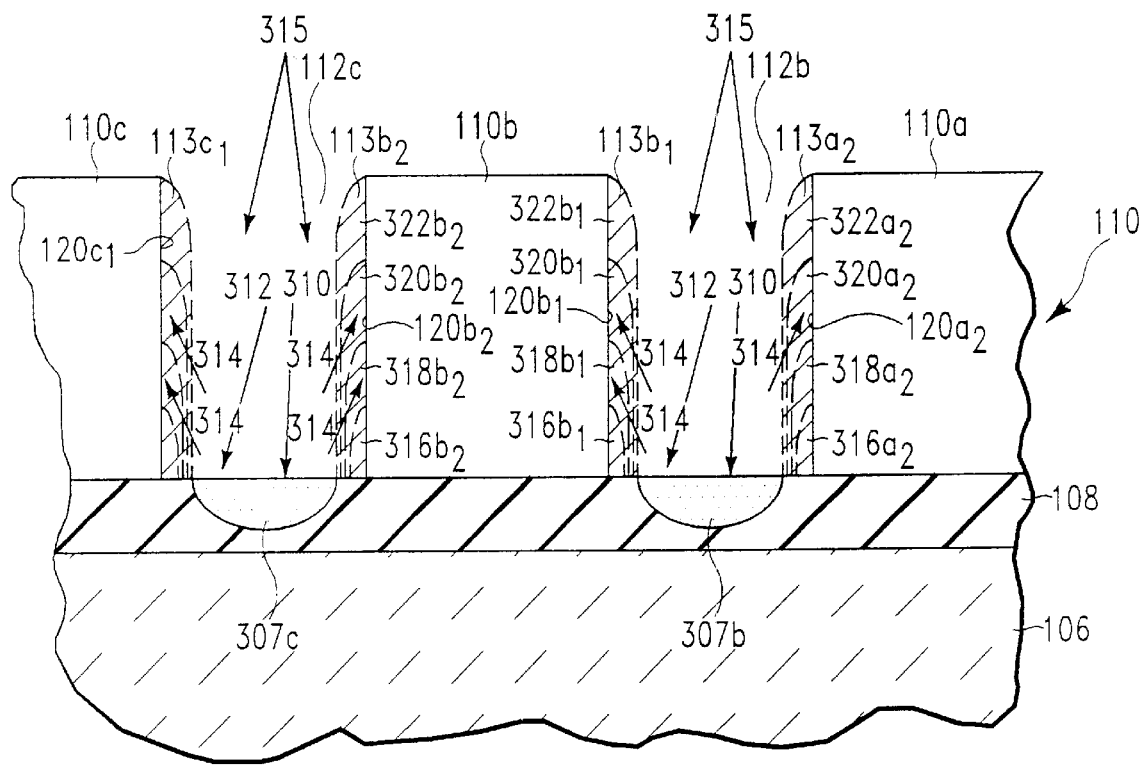
FIG. 3 is another schematic of the cross-sectional view of the etch stack shown in FIG. 2, including the mechanism believed to be responsible for the formation of a built-up structure upon the surface of a patterned photoresist mask.

FIG. 3 illustrates the mechanism believed to control the formation of built-up structures on the opened surfaces of the patterned mask. FIG. 3 is the schematic of a cross-sectional view of a patterned mask 110 having lines 110a, 110b, and 110c which are separated by spaces 112b and 112c, respectively. Patterned mask 110 overlies ARC layer 108, which overlies polysilicon layer 106. In order to form built-up structures $113a_2$, $113b_1$, $113b_2$, and 113c, for example on patterned mask 110 sidewalls $120a_2$, $120b_1$, $120b_2$, and $120c_1$, respectively, it is necessary to apply a polymer-forming plasma species 315 and to physically bombard 312 the sidewalls 120 during application of the polymer-forming plasma species 315.

We have discovered that it is necessary to apply etchants 310 to underlying ARC layer 108 simultaneously with the addition of a polymer-forming plasma species 315 to obtain proper growth/formation of built-up structures 316, leading to 318, leading to 320, leading to 322 (all of which combined make up 113). Without the presence of species produced by etching of underlying ARC layer 108 (or other underlying layer), no built-up structures were observed to be formed. It appears the formation of the polymer which provides the built-up structures requires the presence of atoms 314 from ARC layer 108. Even if another method were developed for furnishing of these atoms (which are presently furnished by sputtering of the underlying substrate), it is more economical in terms of processing time to form the built-up structures 113 while etching ARC layer 108. Areas 307b and 307c are illustrative of ARC layer 108 etching which may be done simultaneously with the formation of built-up structures 113.

Since the built-up structure 113 depends on the presence of atoms 314 from ARC layer 108 for its formation, the built-up structure 113 begins to form most rapidly at the base of a sidewall $120a_2$ and to continue formation upward toward the top of patterned mask 110, as illustrated by partial built-up structures $316a_2$; leading to $318a_2$, leading to 320a; leading to 322a, with each addition building upon a prior deposit, for example. Other built-up structures in various stages of formation are shown by corresponding numbering with reference to sidewalls 120*b*, 120*b$_2$*, and 120*c$_1$*. Our testing showed that the built-up structure formed using any of the ARC materials commonly in use in the semiconductor industry at this time.

EXAMPLE TWO

Figure 4:
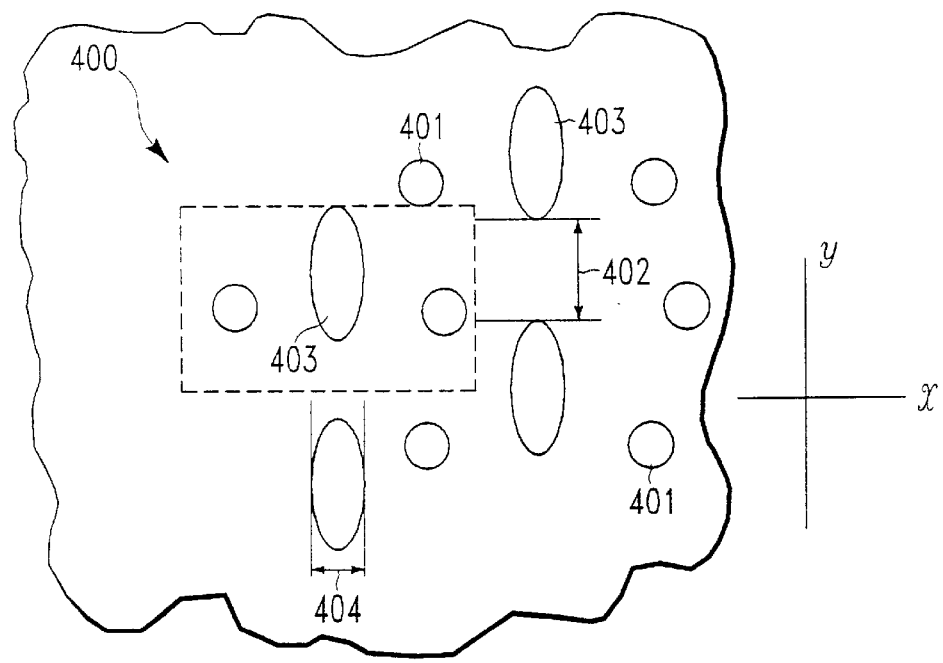
FIG. 4 is a schematic top view of etched polysilicon pads, showing a distance between the ends of large pads (on a "y" axis) and distances across the narrow dimension of a large pad itself (on the "x" axis). These distances are measured for polysilicon pads produced without built-up structures on the mask surface and for polysilicon pads produced with built-up structures on the mask surface. A comparison of the distances shows the effect of the built-up structures on controlling dimensions of the polysilicon pad itself and the distances between the pads.

Although patterned masks having a pattern of lines and spaces have been used in FIGS. 1–3 for more simple illustrative purposes, polysilicon etch patterns are typically in the form of "mesas" or "pads", which are generally circular or elliptical in shape. FIG. 4 shows a top view of a pattern of the kind frequently used during the evaluation of polysilicon etch processes. Measurement of dimensions on an "x"–"y" axis which represents the two dimensional surface area at the base of the patterned mask. These dimensions can be related directly to the dimensions of the openings through the mask and to the dimensions of the etched polysilicon pads which will be obtained using the mask. In Structure 400 shown in FIG. 4, the "x" axis is shown in a direction parallel to the top and the bottom edges of the drawing page and the "y" axis is shown in a direction parallel to the side edges of the drawing page. For example purposes, in pattern 400, there are circular-shaped mask pads 401 and elliptical-shaped mask pads 403. The dimensions measured during our experimentation were typically the spacing 402 on the "y" axis between the lengthwise ends of elliptical-shaped mask pads 403 and the spacing 404 on the "x" axis across the more narrow width of the elliptical-shaped mask pad 403. Different dimensions could have been used, if desired, for measurement purposes.

Figure 5:
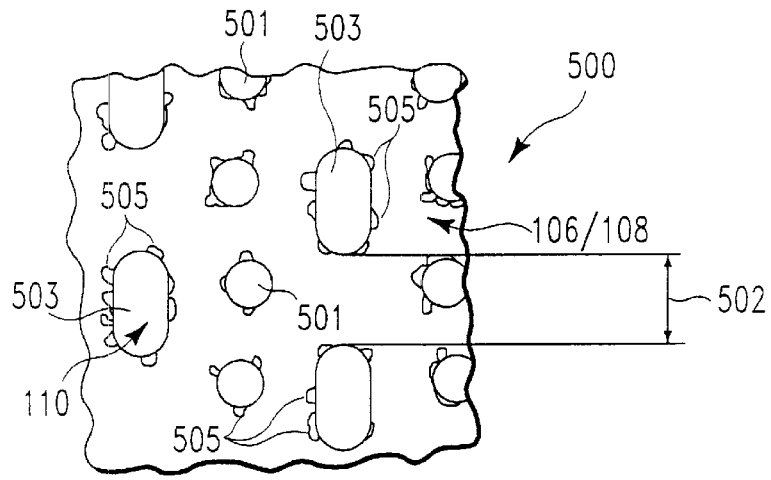
FIG. 5 is a schematic top view of etched polysilicon pads where the deposition of built-up structural material is inadequate and spotty build-up results.
Figure 6:
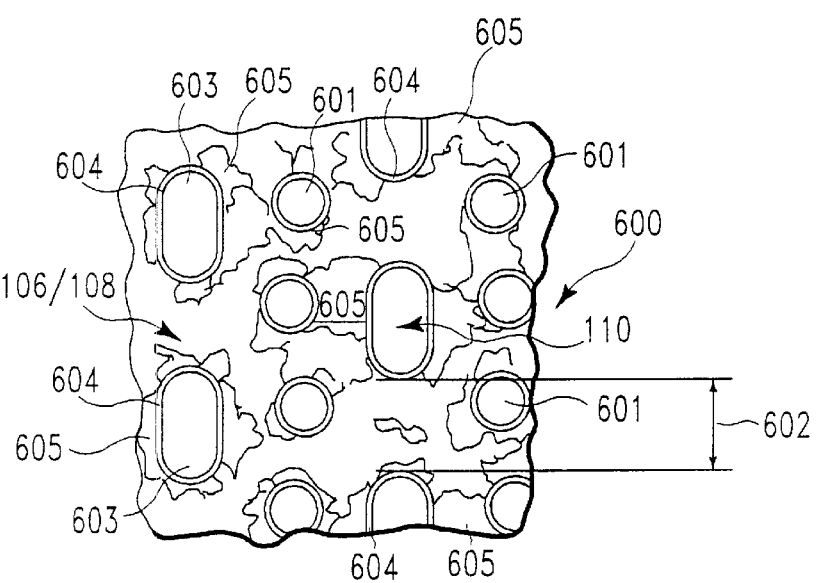
FIG. 6 is a schematic top view of etched polysilicon pads where the deposition of built-up structural material is excessive and prevents proper etching of the pads, where there is incomplete polysilicon etching between the pads.

To provide a controlled deposit of the built-up layer, process variables may need to be tuned to the particular processing apparatus used. One skilled in the art can do this with minimal experimentation in view of the present disclosure. For example, Structure 500 shown in FIG. 5 shows a patterned mask layer 110 having an underlying substrate comprising polysilicon layer 108 which may have some ARC 106 residue remaining. In this instance, the patterned mask pads 501 and 503 included outlying polymeric deposit areas 505 which were splotchy and irregular. These polymeric deposits, which did not provide an adequate built-up structure, were made using a method of the kind described in Table 1, where the "Deposition of Built-up Structure" is described as "Rare". The "y" axis spacing 502 between elliptical mask pads 653 was not effectively decreased. At the same time, it is possible to make excessive polymeric deposits, as illustrated by Structure 600 shown in FIG. 6, which shows a patterned mask layer 110 having an underlying substrate comprising polysilicon layer 108 which may have some ARC 106 residue remaining. In this latter instance, there are patterned mask pads 601 and 603 having increased dimensions represented by 604, and a decreased "y" axis spacing 602. However, there are also large amounts of excessive polymeric build up 605 at locations on the mask sidewall surfaces (not shown) and at the base of the mask opening. Process conditions which produced this excessive polymer build up 605 are described in Table 1, where the "Deposition of Built-up Structure" is described as "Too Much".

Figure 7:
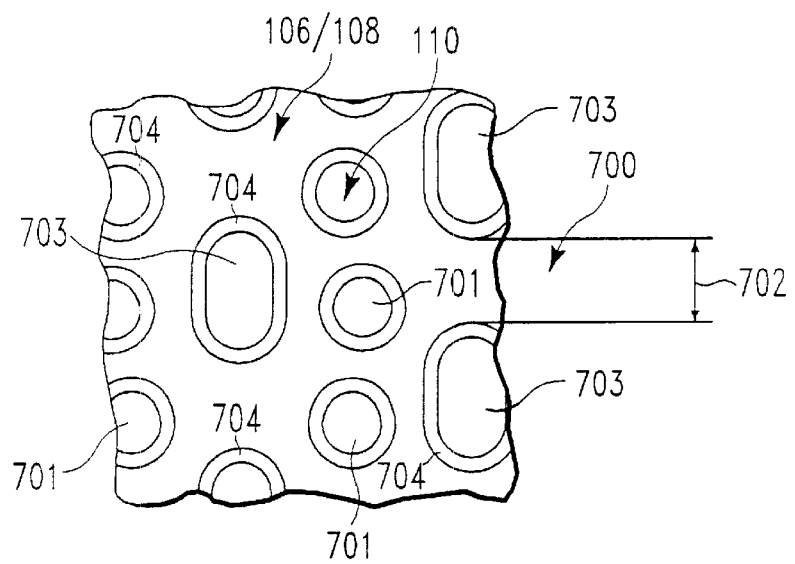
FIG. 7 is a schematic top view of etched polysilicon pads where the deposition is properly controlled to produce an etched pad having the desired dimensions. The pad is typically slightly wider at the bottom than at the top.

Structure 700 shown in FIG. 7 shows a patterned masking layer 110 having an underlying substrate comprising polysilicon layer 108 which may have some ARC 106 residue remaining. In this instance there are patterned mask pads 701 and 703 having increased dimensions represented by 704 (attributable to the selective application of built-up structures), and a decreased "y" axis spacing 702. The polymeric deposits were selectively made to provide a built-up structure which provided the desired patterned mask dimensions. The decrease in "y" axis spacing is representative of a decrease in the critical dimension of a feature over that which could be obtained using the DUV photoresist and currently available pattern imaging techniques.

Photomicrographs of mask pads having the built-up structures which provided increased dimensions 704 show excellent mask pad cross-sectional profiles, where angle θ shown in FIG. 2 was estimated to have been in the range of about 87 degrees. An angle θ higher than about 70 degrees is considered to be acceptable.

The data presented in Table I is for a DUV photoresist patterned mask which could be used to etch polysilicon pads of the kind shown in FIGS. 4 through 7. The sidewall surfaces of the patterned mask were altered by selectively applying built-up structures to reduce the critical dimensions of the mask openings (which determine the spacing between the etched polysilicon pads). The plasma source gas during formation of the built-up structures (and during the simultaneous etching of the underlying silicon oxynitride ARC layer) was a combination of $NH_3$, $Cl_2$, and Ar. The initial etch stack, from bottom to top, included a substrate; a 1,000Å thick overlying layer of silicon oxide; a 3,000Å thick overlying layer of polysilicon; a 600Å thick layer of silicon oxynitride ARC; and a 7,300Å thick patterned DUV mask. The DUV material was TOK®, obtained from a Japanese manufacturer.

The residence time for the plasma source gas during formation of the built-up structures was calculated based on V/S where V is the volume of the process chamber (about 35,000 cc) and S is the effective pump speed for gas removal from the process chamber. When the residence time is too short, the time necessary for polymer formation may not be enough. This is particularly true since the polymer forming source gas must react with sputtered species from either the masking material or from the ARC or other substrate underlying the patterned mask to form the built-up structures.

The substrate bias must also be carefully controlled, as a low substrate bias may not provide sufficient ion energy at the substrate surface to clean the polymer off the openings at the base of the patterned mask. Too high an ion energy may damage the substrate surface.

Although the data in Table 1 is with reference to the built-up structures on the patterned mask sidewalls and the resultant change in critical dimension of the mask openings, the mask was subsequently used to etch an underlying polysilicon layer to confirm that the built-up structure could perform satisfactorily under the etch conditions used to etch the polysilicon layer. Both the built-up structure formation and the etching of the polysilicon pads was carried out in a CENTURA® etch system provided by Applied Materials, Inc. of Santa Clara Calif. The basic elements present in the etch chamber are those shown in FIG. 8, and references to source power, bias power, cathode temperature and other process variables are based on the elements shown in FIG. 8.

The goal at the beginning of experimentation was to control the critical dimension at about 0.13±0.02 μm; to have a profile angle θ of at least 70 degrees; and to have a process time of less than about 100 seconds. Further, it was desired to maintain a selectivity between the photoresist and the ARC layer which would ensure that the photoresist remaining upon initiation of the polysilicon etch would be adequate.

TABLE 1

FORMATION OF BUILT-UP STRUCTURES USING A PLASMA SOURCE GAS CONTAINING NH$_3$, Cl$_2$, AND ARGON

| Sample ID | NH3 sccm | Ar scm | Cl2 sccm | p mT | Ws/Wb | V volt | t sec | τ msec | T °C. | Deposition of Built-Up Structure | CD "X" BIAS μm lg pad | CD "X" BIAS μm sm pad |
|---|---|---|---|---|---|---|---|---|---|---|---|---|
| 1 | 70 | 80 | 15 | 5 | 600/150 | −201 | 50 | 84 | 10 | Rare | N/A | N/A |
| 2 | 40 | 40 | 15 | 5 | 600/150 | −206 | 50 | 146 | 10 | Irreg. Depo | N/A | N/A |
| 3 | 70 | 80 | 15 | 80 | 600/150 | −313 | 50 | 1341 | 10 | Too Much | 0.14 | 0.14 |
| 4 | 40 | 40 | 15 | 50 | 600/150 | −297 | 50 | 1455 | 10 | Too Much | 0.08 | 0.10 |
| 5 | 10 | 30 | 20 | 30 | 600/150 | −328 | 50 | 1383 | 10 | Slt. Much | 0.13 | 0.12 |
| 6 | 10 | 40 | 10 | 30 | 600/150 | −295 | 50 | 1383 | 10 | Baseline | 0.13 | 0.12 |
| 7 | 10 | 20 | 10 | 20 | 600/150 | −265 | 50 | 1383 | 50 | Reduction in Ar | 0.08 | 0.11 |
| 8 | 10 | 40 | 10 | 30 | 600/100 | −231 | 50 | 1383 | 50 | Reduction in Bias Power | 0.07 | 0.10 |
| 9 | 10 | 40 | 10 | 30 | 300/150 | −313 | 50 | 1383 | 50 | Red. Source & Bias Pwr | 0.06 | 0.10 |
| 10 | 10 | 40 | 10 | 30 | 900/150 | −105 | 50 | 1383 | 50 | Rare Deposition | 0.06 | 0.07 |
| 11 | 10 | 60 | 10 | 30 | 600/150 | −170 | 50 | 1037 | 50 | Too Much Deposition | 0.08 | 0.08 |
| 12 | 10 | 30 | 10 | 30 | 600/150 | −309 | 50 | 1659 | 50 | Very Little Deposition | 0.06 | 0.06 |
| 13 | 10 | 40 | 10 | 36 | 600/150 | −290 | 50 | 1659 | 50 | Very Little Deposition | 0.05 | 0.04 |
| 14 | 10 | 40 | 10 | 24 | 600/150 | −240 | 50 | 1106 | 50 | Very Little Deposition | 0.09 | 0.08 |
| 15 | 40 | 40 | 15 | 10 | 600/150 | −237 | 50 | 291 | 50 | Rare Deposition | 0.03 | 0.03 |

Note that a larger CD "X" BIAS value means the dimension across the width of the mask pattern would be increased (per FIG. 4). This means the opening in the mask through which the silicon layer is etched is smaller, due to an increased thickness of the built-up structure on the sidewall of the patterned mask. Therefore a larger CD "X" BIAS value actually indicates a smaller critical dimension in the spacing between etched polysilicon pads.
"p" represents the process chamber pressure in mT. "Ws" represents the plasma source power in Watts. "Wb" represents the substrate bias power in Watts, while "V" represents the actual bias voltage on the substrate surface. "t" represents the time of built-up structure formation in seconds. "τ" represents the residence time in milliseconds. "T" represents the temperature of the cathode (substrate support platen on which the substrate sets) Typically the actual substrate temperature is approximately the same as the cathode temperature.

Using the process conditions described above, we were able to obtain a built up structure on the sidewall of the patterned mask having a thickness of about 0.7 μm, which resulted in a reduction of the mask opening critical dimension from about 0.35 μm to about 0.21 μm. The profile angle θ at the base of the patterned mask was approximately 80 degrees. Further, with respect to sample numbers 3, 5, and 6, we found that the built-up structure acted as a part of the patterned mask during the main polysilicon etching, with adequate photoresist thickness remaining after completion of the polysilicon etching. Typically, the thickness of the photoresist was reduced from about 7,300Å to about 5,700Å during the formation of the built-up layer and the etch rate ratio of silicon oxynitride ARC:DUV photoresist was about 6:1.

FIGS. 9–13 show the effect of process variables on the CD "X" BIAS, where, as explained above, an increased CD "X" BIAS actually represents a smaller critical dimension in the etched polysilicon. Process conditions other than those varied as described with reference to a given figure are the process conditions provided in Table 1 for Sample ID #6, which is described as "Baseline". Although the particular numbers presented below are apparatus sensitive and are applicable to the CENTURA® etch apparatus, the trends indicated for a change in a given process variable are applicable to other semiconductor processing apparatus as well.

Figure 9:
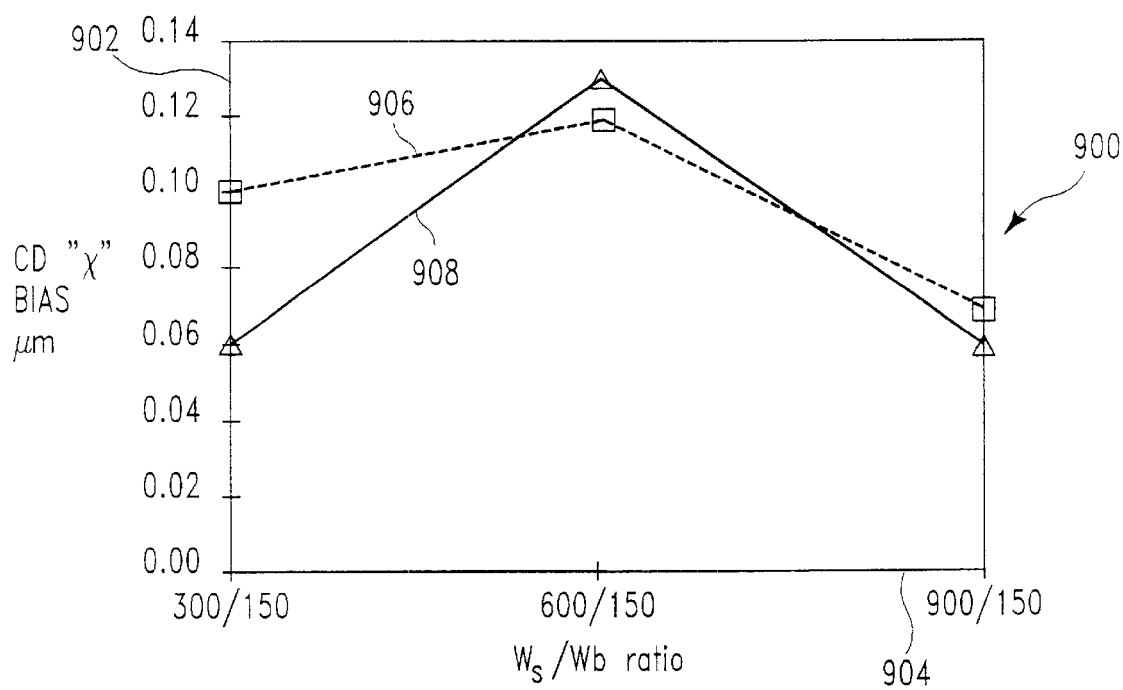
FIG. 9 shows a graph 900 with the CD "X" BIAS on axis 902, as a function of the ratio of the plasma source power (in Watts) to the substrate bias power (in Watts) on axis 904. The CD "X" BIAS relates directly to the critical dimension in the substrate which is etched using the patterned masking material with built-up structures.

FIG. 9 is a graph 900 showing the CD "X" BIAS, on axis 902, as a function of the ratio of the plasma source power (in Watts) to the substrate bias power (in Watts), on axis 904. Curve 906 represents the CD "X" BIAS for the small polysilicon pad features and Curve 908 represents the CD "X" BIAS for the large polysilicon pad features.

Figure 10:
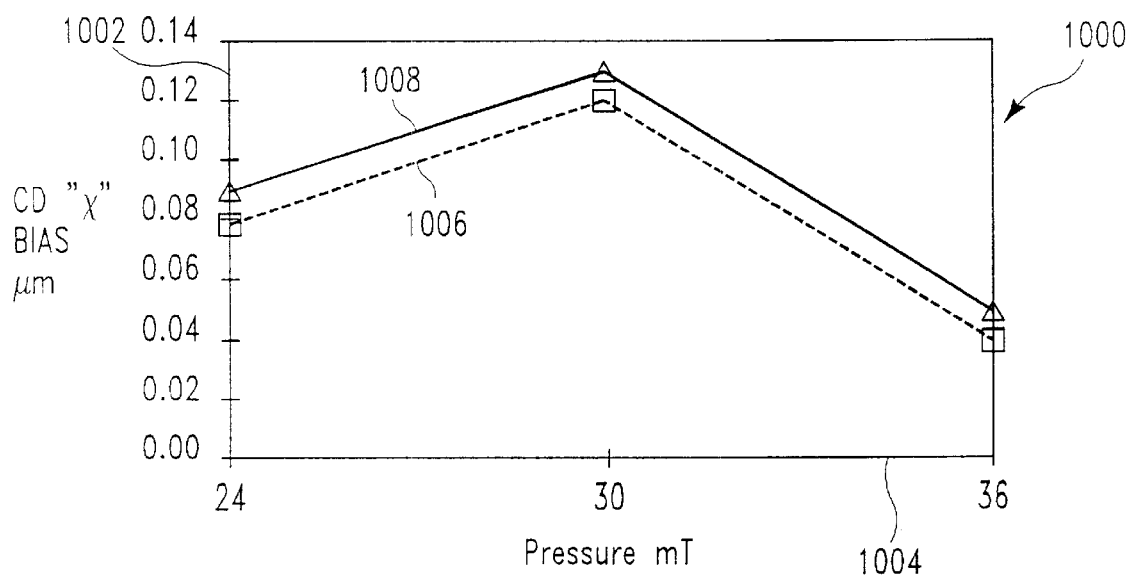
FIG. 10 shows a graph 1000 with the CD "X" BIAS on axis 1002, as a function of the process chamber pressure in mT on axis 1004.

FIG. 10 is a graph 1000 showing the CD "X" BIAS, on axis 1002, as a function of the process chamber pressure in mT, on axis 1004. Curve 1006 represents the CD "X" BIAS for the small polysilicon pad features and Curve 1008 represents the CD "X" BIAS for the large polysilicon pad features.

Figure 11:
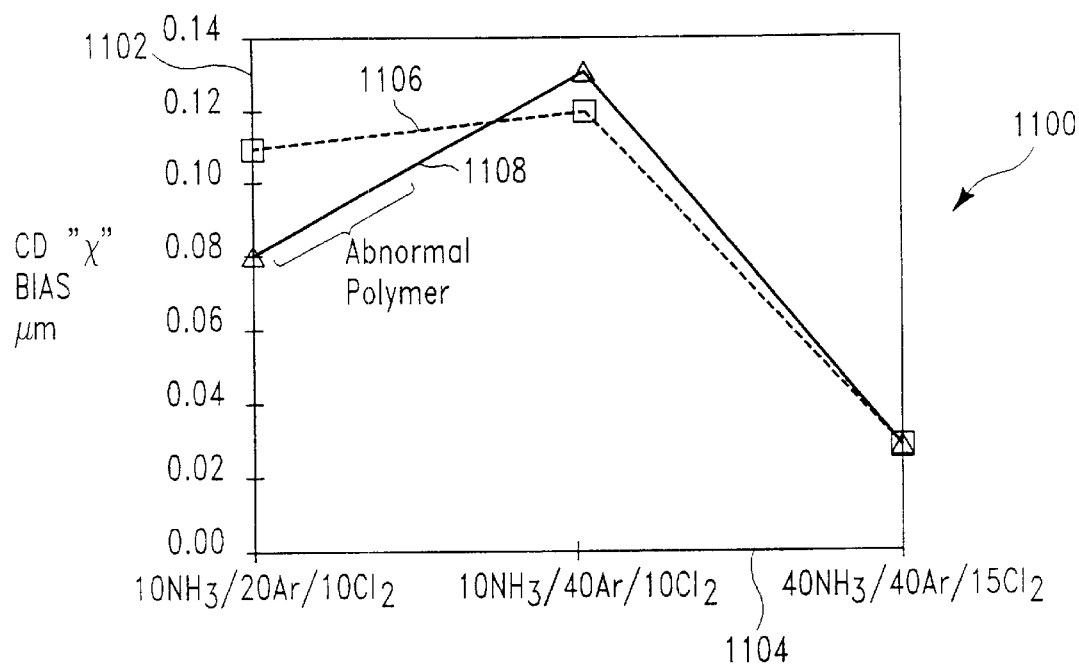
FIG. 11 shows a graph 1100 with the CD "X" BIAS on axis 1102, as a function of various source gas combinations and flow rates (in sccm) on axis 1104.

FIG. 11 is a graph 1100 showing the CD "X" BIAS, on axis 1102, as a function of various source gas combinations and flow rates (in sccm), on axis 1104. Curve 1106 represents the CD "X" BIAS for the small polysilicon pad features and Curve 1108 represents the CD "X" BIAS for the large polysilicon pad features.

Figure 12:
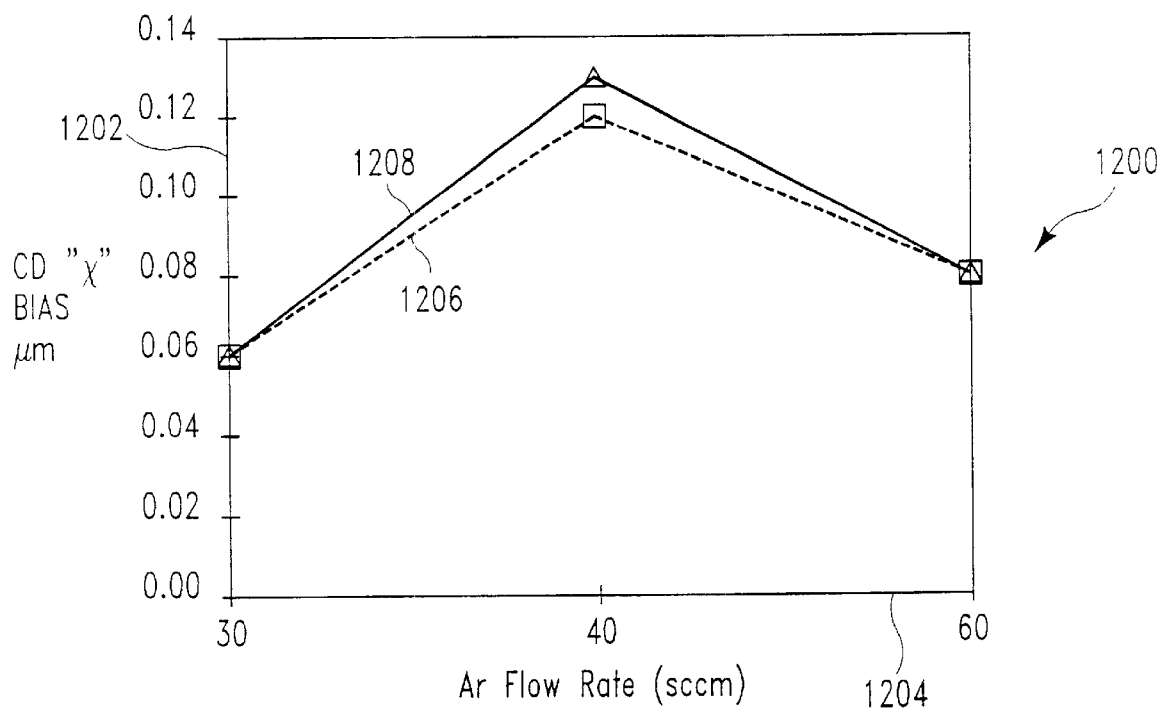
FIG. 12 shows a graph 1200 with the CD "X" BIAS on axis 1202, as a function of the argon flow rate (in sccm) on axis 1204. The argon flow rate (in combination with the amount of substrate bias applied) determines the amount of physical bombardment of surfaces contracted by the etch plasma.

FIG. 12 is a graph 1200 showing the CD "X" BIAS, on axis 1202, as a function of the argon flow rate (in sccm), on axis 1204. Curve 1206 represents the CD "X" BIAS for the small polysilicon pad features and Curve 1208 represents the CD "X" BIAS for the large polysilicon pad features. The argon flow rate (in combination with the amount of substrate bias applied) determines the amount of physical bombardment of surfaces contacted by the plasma.

Figure 13:
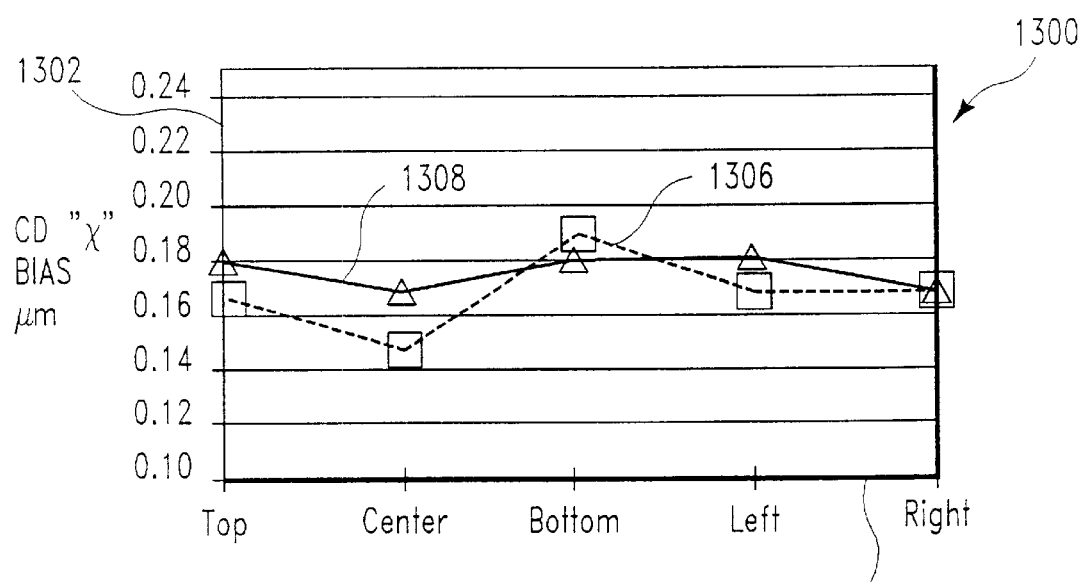
FIG. 13 shows a graph 1300 with the CD "X" BIAS on axis 1302, as a function of the position on the substrate (wafer) surface on axis 1304.

FIG. 13 is a graph 1300 showing the CD "X" BIAS, on axis 1302, as a function of the position on the substrate (wafer) surface, on axis 1304. Curve 1306 represents the CD "X" BIAS for the small polysilicon pad features and Curve 1308 represents the CD "X" BIAS for the large polysilicon pad features.

EXAMPLE THREE

The data presented in Table II is for the same DUV photoresist patterned mask and the same etch stack as that described for Example Two, above. However, the plasma source gas during formation of the built-up structures (and during the simultaneous etching of the underlying silicon oxynitride ARC layer) was a combination of $CH_2F_2$, $Cl_2$, and Ar. The process variables described in Table 2 are the same process variables which were described with reference to Example Two and the process apparatus was the same.

TABLE 2

FORMATION OF BUILT-UP STRUCTURES USING A PLASMA SOURCE GAS CONTAINING $CH_2F_2$, $Cl_2$, AND ARGON

| Sample ID | CH2F2 sccm | Ar sccm | Cl2 sccm | p mT | Ws/Wb | t sec | τ msec | T °C. | Deposition of Built-Up Structure | CD "X" BIAS μm lg pad | CD "X" BIAS μm sm pad |
|---|---|---|---|---|---|---|---|---|---|---|---|
| 1 | 10 | 40 | 10 | 30 | 600/150 | 60 | 1383 | 10 | Some | | |
| 2 | 20 | 40 | 10 | 30 | 600/150 | 60 | 1185 | 10 | Medium | | |
| 3 | 40 | 40 | 10 | 30 | 600/150 | 60 | 922 | 10 | Very Good | | |
| 4 | 20 | 40 | 10 | 60 | 600/150 | 60 | 2370 | 10 | Very Good | | |
| 5 | 20 | 40 | 10 | 50 | 600/150 | 60 | 1975 | 10 | Good | 0.086 | 0.084 |
| 6 | 40 | 40 | 10 | 50 | 600/200 | 60 | 1536 | 10 | Baseline | 0.086 | 0.071 |
| 7 | 40 | 40 | 20 | 50 | 600/200 | 60 | 1383 | 10 | Better CD | 0.114 | 0.128 |
| 8 | 40 | 40 | 20 | 50 | 600/200 | 60 | 1383 | 10 | Good Profile | 0.143 | 0.143 |
| 9 | 40 | 40 | 20 | 50 | 300/200 | 60 | 1383 | 10 | Good Profile | 0.129 | 0.131 |
| 10 | 20 | 40 | 10 | 50 | 900/150 | 70 | 1975 | 10 | Good Profile | 0.100 | 0.100 |

Note that a larger CD "X" BIAS value means the dimension across the width of the patterned mask pad would be increased (per FIG. 4). This means the opening in the mask through which the silicon layer is etched is smaller, due to an increased thickness of the built-up structure on the sidewall of the patterned mask. Therefore a larger CD "X" BIAS value actually indicates a smaller critical dimension in the spacing between etched polysilicon pads.
"p" is the process chamber pressure in mT. "Ws" represents the plasma source power in Watts. "Wb" represents the substrate bias power in Watts. "t" represents the time of built-up structure formation in seconds. "τ" represents the residence time in milliseconds. "T" represents the temperature of the cathode (substrate support platen on which the substrate sets) Typically the actual substrate temperature is approximately the same as the cathode temperature.

The profile angle θ for the patterned mask including built-up structure at the base of the mask was 87 degrees. An excellent vertical profile was obtained.

TABLE 3

POLYSILICON ETCH AFTER FORMATION OF BUILT-UP STRUCTURES ON PATTERNED MASK SURFACE

| Sample ID | Step | CH2F2 sccm | CF4 | N2 | Ar | He | Cl2 | HBr | O2 | Ws/Wb | t sec | T °C. | Comments |
|---|---|---|---|---|---|---|---|---|---|---|---|---|---|
| 1 | BT | | 80 | | | | | | | 500/10 | 24.7 | 10 | Tapered |
| | PSE | | | 8 | | | 130 | | | 800/80 | 53.3 | | Profile |
| 2 | BARC | 30 | 30 | | | 40 | | | | 500/450 | 12 | 10 | Straight |
| | PSE | | | | | | 68 | 112 | 5 | 475/80 | 83.7 | | Profile |
| 3 | BARC | 30 | 30 | | | 40 | | | | 500/450 | 5 | 10 | Non-uniform Etching |
| | PSE | | | | | | 68 | 112 | 5 | 475/80 | 165 | | |

TABLE 3-continued

POLYSILICON ETCH AFTER FORMATION OF BUILT-UP STRUCTURES ON PATTERNED MASK SURFACE

| Sample ID | Step | CH2F2 sccm | CF4 | N2 | Ar | He | Cl2 | HBr | O2 | Ws/Wb | t sec | T °C. | Comments |
|---|---|---|---|---|---|---|---|---|---|---|---|---|---|
| 4 | BARC | 30 | 30 | | | 40 | | | | 500/200 | 58.6 | 10 | Tapered |
| | PSE | | | | | | 68 | 112 | 5 | 475/80 | 165 | | Profile |
| 5 | BARC | 30 | 30 | | 20 | | | | | 500/450 | 27 | 10 | Unstable |
| | PSE | | | | | | 68 | 112 | 5 | 475/80 | 130 | | Plasma |

"BT" represents "Break Through" of the ARC and any native oxide resident on the surface of the polysilicon. "PSE" represents the polysilicon etch step. "BARC" represents break through of a bottom ARC layer. All gas flow rates are in standard cubic centimeters per minute (sccm). Ws" represents the plasma source power in Watts. "Wb" represents the substrate bias power in Watts. "t" represents the etch time in seconds. "T" represents the temperature of the cathode (substrate support platen on which the substrate sets). During polysilicon etch, typically the actual substrate temperature is approximately 20° C. to about 45° C. higher than the cathode temperature.

In confirmation that the built-up structure was performing as an integral part of the patterned mask during the polysilicon etch step, photomicrographs were made and measurements taken for the "y" inter edge spacings for the large etched polysilicon pads. When no built-up structure was applied to the patterned mask prior to etching of the polysilicon, the "Y" value was about 0.49 μm and when the built-up structure was applied, the "y" value was reduced to about 0.31 μm—a reduction of 0.18 μm.

Excellent reduction in the "y" value can be obtained using the $NH_3$, $Cl_2$, Argon or the $CH_2F_2$, $Cl_2$, and Argon plasma source gas system during formation of the built-up structure. However, if HBr is used during the polysilicon etch, the plasma source gas system utilizing $CH_2F_2$ must be used to avoid contamination of the process chamber and auxiliary gas lines.

The above described preferred embodiments are not intended to limit the scope of the present invention, as one skilled in the art can, in view of the present disclosure expand such embodiments to correspond with the subject matter of the invention claimed below.

We claim:

1. A method of depositing built-up structures upon a patterned mask surface resting on a substrate, which built-up structures facilitate dimensional control of a pattern to be etched subsequently using said mask, said method comprising the following steps:
   (a) providing said patterned mask surface resting on said substrate;
   (b) depositing a polymeric built-up structure over at least a portion of said patterned mask surface using a plasma formed from a source gas comprising $Cl_2$, a compound which comprises fluorine, and an inert gas; followed by
   (c) etching at least a portion of said substrate through said mask using a plasma etchant source gas which includes HBr.

2. The method of claim 1, including an additional step:
   (c) etching a polysilicon layer underlying said patterned mask surface using a plasma etchant source gas which includes HBr.

3. The method of claim 1 or claim 2, wherein said compound which comprises fluorine includes carbon.

4. The method of claim 3, wherein said compound which comprises fluorine has the formula $C_x H_y F_z$, where x ranges from 1 to about 5; y ranges from 0 to about 11; and z ranges from 1 to about 10.

5. The method of claim 4, wherein said compound which comprises fluorine is selected from the group consisting of $CF_4$, $CHF_3$, $CH_2F_2$, and $CH_3F$.

6. The method of claim 3, wherein said compound comprising carbon and fluorine also contains chlorine.

7. The method of claim 6, wherein said compound which comprises fluorine is $CF_3Cl$.

8. The method of claim 1 or claim 2, wherein said inert gas is selected from the group consisting of helium, nitrogen, argon, krypton, and xenon.

9. The method of claim 8, wherein said inert gas is selected from the group consisting of argon, krypton and xenon.

10. The method of claim 1 or claim 2, wherein said patterned mask is comprised of an inorganic masking material, an organic masking material, a hydrocarbon material, or combinations thereof.

11. The method of claim 1 or claim 2, wherein a bias is applied to said substrate.

12. The method of claim 11, wherein the amount of bias applied creates a voltage on a surface of said mask ranging from about −200 V to about −600 V.

13. The method of claim 1 or claim 2, wherein said substrate includes a layer which comprises silicon and oxygen.

14. The method of claim 13, wherein said layer which comprises silicon and oxygen also comprises nitrogen.

15. A method of depositing built-up structures upon a patterned mask surface resting on a substrate, which built-up structures facilitate dimensional control of a pattern to be etched subsequently using said mask, and wherein said built-up structures are not subsequently exposed to a plasma formed from a source gas including HBr, said method comprising the steps of:
   (a) providing said patterned mask surface resting upon said substrate;
   (b) depositing a polymeric built-up structure over at least a portion of said patterned mask surface using a plasma formed from a source gas comprising $Cl_2$, $NH_3$ and an inert gas; followed by
   (c) etching at least a portion of said substrate through said mask.

16. The method of claim 15, wherein said substrate includes a layer which comprises silicon and oxygen.

17. The method of claim 16, wherein said layer which comprises silicon and oxygen also comprises nitrogen.

18. The method of Claim 15, wherein said inert gas is selected from the group consisting of helium, nitrogen, argon, krypton, and xenon.

19. The method of claim 18, wherein said inert gas is selected from the group consisting of argon, krypton and xenon.

20. The method of claim 15, wherein said patterned mask is comprised of a material selected from the group consisting of an inorganic material, an organic material, a hydrocarbon material, or combinations thereof.

21. The method of claim 15, where a bias is applied to said patterned mask and said substrate.

22. The method of claim 21, wherein an amount of bias is applied which is adequate to create a voltage on the surface of said mask ranging from about −200 V to about −600 V.

* * * * *